(12) United States Patent
Ma et al.

(10) Patent No.: US 11,869,438 B2
(45) Date of Patent: Jan. 9, 2024

(54) DISPLAY DEVICE INCLUDING SCAN DRIVER INCLUDING SCAN SIGNAL OUTPUT CIRCUIT, SIGNAL DISTRIBUTION CIRCUIT AND SCAN-OFF CIRCUIT

(71) Applicant: SAMSUNG DISPLAY CO., LTD., Yongin-si (KR)

(72) Inventors: Hyung Gun Ma, Yongin-si (KR); Ji Woong Kim, Yongin-si (KR); Jun Yong Song, Yongin-si (KR); Seong Joo Lee, Yongin-si (KR); Keum Dong Jung, Yongin-si (KR); Sang Hyun Heo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/671,969

(22) Filed: Feb. 15, 2022

(65) Prior Publication Data

US 2023/0031695 A1 Feb. 2, 2023

(30) Foreign Application Priority Data

Aug. 2, 2021 (KR) .......................... 10-2021-0101602

(51) Int. Cl.
*G09G 3/32* (2016.01)
*G09G 3/3266* (2016.01)
(Continued)

(52) U.S. Cl.
CPC ........... *G09G 3/3266* (2013.01); *H01L 25/18* (2013.01); *G09G 3/3275* (2013.01);
(Continued)

(58) Field of Classification Search
CPC ......... G09G 3/3266; G09G 2300/0814; G09G 2310/0286; G09G 2310/0289;
(Continued)

(56) References Cited

U.S. PATENT DOCUMENTS

| 9,337,343 B2 | 5/2016 | Yamazaki et al. |
| 10,008,176 B2 | 6/2018 | Kim et al. |

(Continued)

FOREIGN PATENT DOCUMENTS

| KR | 100764047 B1 | 10/2007 | |
| KR | 20120131463 A | * 12/2012 | ............... G09G 3/36 |

(Continued)

*Primary Examiner* — Adam J Snyder
(74) *Attorney, Agent, or Firm* — CANTOR COLBURN LLP

(57) ABSTRACT

A display device includes a display panel including pixels connected to scan lines and data lines, and connection line connected to the scan lines, and a scan driver which drives scan lines. The scan driver includes a scan signal output circuit which outputs a first output signal as a scan signal to a first output line and outputs a second output signal to a second output line, a signal distribution circuit which outputs the first output signal to a first or third connection line and outputs the second output signal to a second or fourth connection line in response to first and second distribution control signals, and a scan-off circuit which outputs gate-off level to at least one of the scan lines in response to first and second scan-off control signals.

19 Claims, 9 Drawing Sheets

(51) Int. Cl.
*H01L 25/18* (2023.01)
*G09G 3/3275* (2016.01)

(52) U.S. Cl.
CPC ................ *G09G 2300/043* (2013.01); *G09G 2300/0426* (2013.01); *G09G 2300/0814* (2013.01); *G09G 2310/0202* (2013.01); *G09G 2310/0286* (2013.01); *G09G 2310/0289* (2013.01); *G09G 2310/0291* (2013.01); *G09G 2320/0219* (2013.01)

(58) Field of Classification Search
CPC ..... G09G 2300/0426; G09G 2300/043; G09G 2310/0291; G09G 2320/0219; G09G 3/3275; G09G 2310/0202; H01L 25/18

See application file for complete search history.

(56) References Cited

U.S. PATENT DOCUMENTS

| | | | |
|---|---|---|---|
| 2005/0122827 A1* | 6/2005 | Wang | G09G 3/3677 365/232 |
| 2006/0146112 A1* | 7/2006 | Kim | G09G 3/3677 347/149 |
| 2007/0103346 A1* | 5/2007 | Liu | G09G 3/3674 341/50 |
| 2008/0165112 A1* | 7/2008 | Su | G09G 3/3677 345/98 |
| 2010/0039453 A1* | 2/2010 | Chaji | G09G 3/3688 345/690 |
| 2014/0168552 A1* | 6/2014 | Jo | G02F 1/134363 349/33 |

FOREIGN PATENT DOCUMENTS

| | | |
|---|---|---|
| KR | 1020180047613 A | 5/2018 |
| KR | 101994908 B1 | 7/2019 |
| KR | 102105408 B1 | 4/2020 |

* cited by examiner

DISPLAY DEVICE INCLUDING SCAN DRIVER INCLUDING SCAN SIGNAL OUTPUT CIRCUIT, SIGNAL DISTRIBUTION CIRCUIT AND SCAN-OFF CIRCUIT

The application claims priority to Korean patent application number No. 10-2021-0101602, filed on Aug. 2, 2021, the entire disclosure of which is incorporated herein in its entirety by reference.

BACKGROUND

1. Field

Various embodiments of the disclosure relate to an electronic device, and more particularly to a display device.

2. Related Art

Generally, a display device has a structure in which a scan driver is disposed on one side of a display panel and a data driver is disposed on another side of the display panel. Recently, the structure of a display device for a narrow bezel in which a non-display area on both sides of a display device is minimized has been developed. For example, to implement a narrow bezel, research into a panel having a single-side driving structure in which a scan driver and a data driver are arranged together on a same side of the panel has been conducted.

SUMMARY

Various embodiments of the disclosure are directed to a display device having a single-side driving structure that includes a signal distribution circuit and a scan-off circuit of a scan driver integrated into a display panel.

Embodiments of the disclosure provide a display device including a display panel including pixels connected to scan lines and data lines, and connection lines, each connected to a corresponding scan line of the scan lines; and a scan driver which drives the scan lines. In such an embodiment, the scan driver includes a scan signal output circuit which outputs a first output signal as a scan signal to a first output line and outputs a second output signal as the scan signal to a second output line; a signal distribution circuit which outputs the first output signal to a first connection line of the connection lines or a third connection line of the connection lines and outputs the second output signal to a second connection line of the connection lines or a fourth connection line of the connection lines in response to a first distribution control signal and a second distribution control signal; and a scan-off circuit which outputs a gate-off level to at least one of the scan lines in response to a first scan-off control signal and a second scan-off control signal. In such an embodiment, the first to fourth connection lines are respectively connected to first to fourth scan lines of the scan lines extending in a first direction, and the first to fourth scan lines may be sequentially arranged in a second direction intersecting the first direction.

According to an embodiment, the first to fourth connection lines may be sequentially arranged in the first direction.

According to an embodiment, the signal distribution circuit may include a first transistor connected between the first output line and the first connection line, where the first transistor may be turned on in response to the first distribution control signal; a second transistor connected between the second output line and the second connection line, where the second transistor may be turned on in response to the first distribution control signal; a third transistor connected between the first output line and the third connection line, where the third transistor may be turned on in response to the second distribution control signal; and a fourth transistor connected between the second output line and the fourth connection line, where the fourth transistor may be turned on in response to the second distribution control signal.

According to an embodiment, the scan-off circuit may include a first off transistor connected between a power line supplying a voltage having a gate-off level and the first scan line, where the first off transistor may be turned on in response to the first scan-off control signal; a second off transistor connected between the power line and the second scan line, where the second off transistor may be turned on in response to the first scan-off control signal; a third off transistor connected between the power line and the third scan line, where the third off transistor may be turned on in response to the second scan-off control signal; and a fourth off transistor connected between the power line and the fourth scan line, where the fourth off transistor may be turned on in response to the second scan-off control signal.

According to an embodiment, the second distribution control signal may be an inverted signal of the first distribution control signal.

According to an embodiment, the first distribution control signal and the second scan-off control signal may be same signals as each other which are provided from a same signal line.

According to an embodiment, the second distribution control signal and the first scan-off control signal may be same signals as each other which are provided from a same signal line.

According to an embodiment, during a gate-on period of the first distribution control signal, the first and second output signals having a gate-on level may be sequentially provided to the first scan line and the second scan line, respectively.

According to an embodiment, during a gate-on period of the second distribution control signal, the first and second output signals having a gate-on level may be sequentially provided to the third scan line and the fourth scan line, respectively.

According to an embodiment, the scan signal output circuit may be disposed on a flexible film connected to the display panel, the signal distribution circuit and the scan-off circuit may be integrated into the display panel, and the signal distribution circuit may be connected to the scan signal output circuit through the first output line and the second output line.

According to an embodiment, at least a portion of the first to fourth transistors and the first to fourth off transistors may be disposed in a display area of the display panel in which the pixels are arranged.

According to an embodiment, the display device may further include a data driver disposed on one side of the display panel, together with the scan signal output circuit, where the data driver may drive the data lines.

According to an embodiment, the data driver may be disposed, together with the scan signal output circuit, on the flexible film.

According to an embodiment, the scan signal output circuit may include shift registers which sequentially outputs modified signals of an input signal based on a clock signal and dependently connected to each other; logic OR circuits which generates first intermediate signals using outputs of two non-adjacent shift registers, among the shift registers;

logic AND circuits which generates second intermediate signals using respective outputs of the logic OR circuits and an output enable signal; level shifters which adjusts voltage levels of the second intermediate signals to correspond to a high level or a low level of the scan signal; and buffers which provides outputs of the level shifters to the first output line and the second output line, respectively.

According to an embodiment, the signal distribution circuit may further include a fifth transistor connected between the first output line and a fifth connection line, where the fifth transistor may be turned on in response to a third distribution control signal; a sixth transistor connected between the second output line and a sixth connection line, where the sixth transistor may be turned on in response to the third distribution control signal; a seventh transistor connected between the first output line and a seventh connection line, where the seventh transistor may be turned on in response to a fourth distribution control signal; and an eighth transistor connected between the second output line and an eighth connection line, where the eighth transistor may be turned on in response to the fourth distribution control signal. According to an embodiment, the scan-off circuit may further include a fifth off transistor connected between the power line and a fifth scan line, where the fifth off transistor may be turned on in response to a third scan-off control signal; a sixth off transistor connected between the power line and a sixth scan line, where the sixth off transistor may be turned on in response to the third scan-off control signal; a seventh off transistor connected between the power line and a seventh scan line, where the seventh off transistor may be turned on in response to a fourth scan-off control signal; and an eighth off transistor connected between the power line and an eighth scan line, where the eighth off transistor may be turned on in response to the fourth scan-off control signal.

According to an embodiment, the scan driver may further include a decoder which generates the first to fourth distribution control signals and the first to fourth scan-off control signals in response to a control signal provided from an external device, and the first to fourth scan-off control signals may be inverted signals of the first to fourth distribution control signals, respectively.

Embodiments of the disclosure provide a display device including a display panel including pixels connected to scan lines and data lines, and connection lines, each connected to a corresponding scan line of the scan lines; and a scan driver which drives the scan lines. In such an embodiment, the scan driver includes a scan signal output circuit which outputs a first output signal as a scan signal to a first output line and outputs a second output signal as the scan signal to a second output line; a signal distribution circuit which outputs the first output signal to a first connection line of the connection lines or a third connection line of the connection lines and outputs the second output signal to a second connection line of the connection lines or a fourth connection line of the connection lines in response to a first distribution control signal and a second distribution control signal; and a scan-off circuit which outputs a gate-off level to at least one of the scan lines in response to a first scan-off control signal and a second scan-off control signal. In such an embodiment, the first to fourth connection lines are respectively connected to first to fourth scan lines of the scan lines extending in a first direction, each of the signal distribution circuit and the scan-off circuit may include a plurality of transistors, and the transistors may be arranged in a display area of the display panel in which the pixels are arranged.

Embodiments of the disclosure provide a display device including a display panel including pixels connected to scan lines and data lines, and connection lines, each connected to a corresponding scan line of the scan lines; and a scan driver which drives the scan lines. In such an embodiment, the scan driver includes a scan signal output circuit which outputs a first output signal as a scan signal to a first output line and outputs a second output signal as the scan signal to a second output line; a signal distribution circuit which outputs the first output signal to a first connection line of the connection lines or a third connection line of the connection lines and outputs the second output signal to a second connection line of the connection lines or a fourth connection line of the connection lines in response to a first distribution control signal and a second distribution control signal; and a scan-off circuit which outputs a gate-off level to at least one of the scan lines in response to a first scan-off control signal and a second scan-off control signal. In such an embodiment, the first to fourth connection lines are respectively connected to first to fourth scan lines of the scan lines extending in a first direction, during a gate-on period of the first distribution control signal, the first and second output signals having a gate-on level are sequentially provided to the first scan line and the second scan line, respectively, and during a gate-on period of the second distribution control signal, the first and second output signals having the gate-on level are sequentially provided to the third scan line and the fourth scan line, respectively.

According to an embodiment, the first scan-off control signal may be an inverted signal of the first distribution control signal, and the second scan-off control signal may be an inverted signal of the second distribution control signal.

In embodiments of the invention, the display device may include a signal distribution circuit of a scan driver and a scan-off circuit of the scan driver integrated into a display panel. In such embodiments, demultiplexing of scan signal output may be performed using the signal distribution circuit and the scan-off circuit, and thus a dead space and a bezel in a display panel may be reduced. In such embodiments, because the signal distribution circuit is integrated into a display panel, the number of panel pads and chip pads and the size of a scan driver chip may be reduced, and the scan driver chip and a data driver chip may be mounted together in a single flexible film. Thus, manufacturing costs may be reduced.

In such embodiments, the scan-off circuit may stably maintain signals supplied to inactive scan lines at a low voltage, thus preventing malfunction of pixels.

In such embodiments, since scan lines that are not adjacent to each other share output lines with each other, a scan signal may fall (or sink) due to an output signal having a gate-off level, which is output from a scan signal output circuit, rather than a low voltage supplied from a power line (and a power source). Therefore, compared to a scheme for pulling down a scan signal using the low voltage, the effect of preventing a kickback failure from occurring when a transistor (switching transistor) of a pixel is turned off due to the interruption of supply of the scan signal may be further improved.

DETAILED DESCRIPTION

Figure 1:
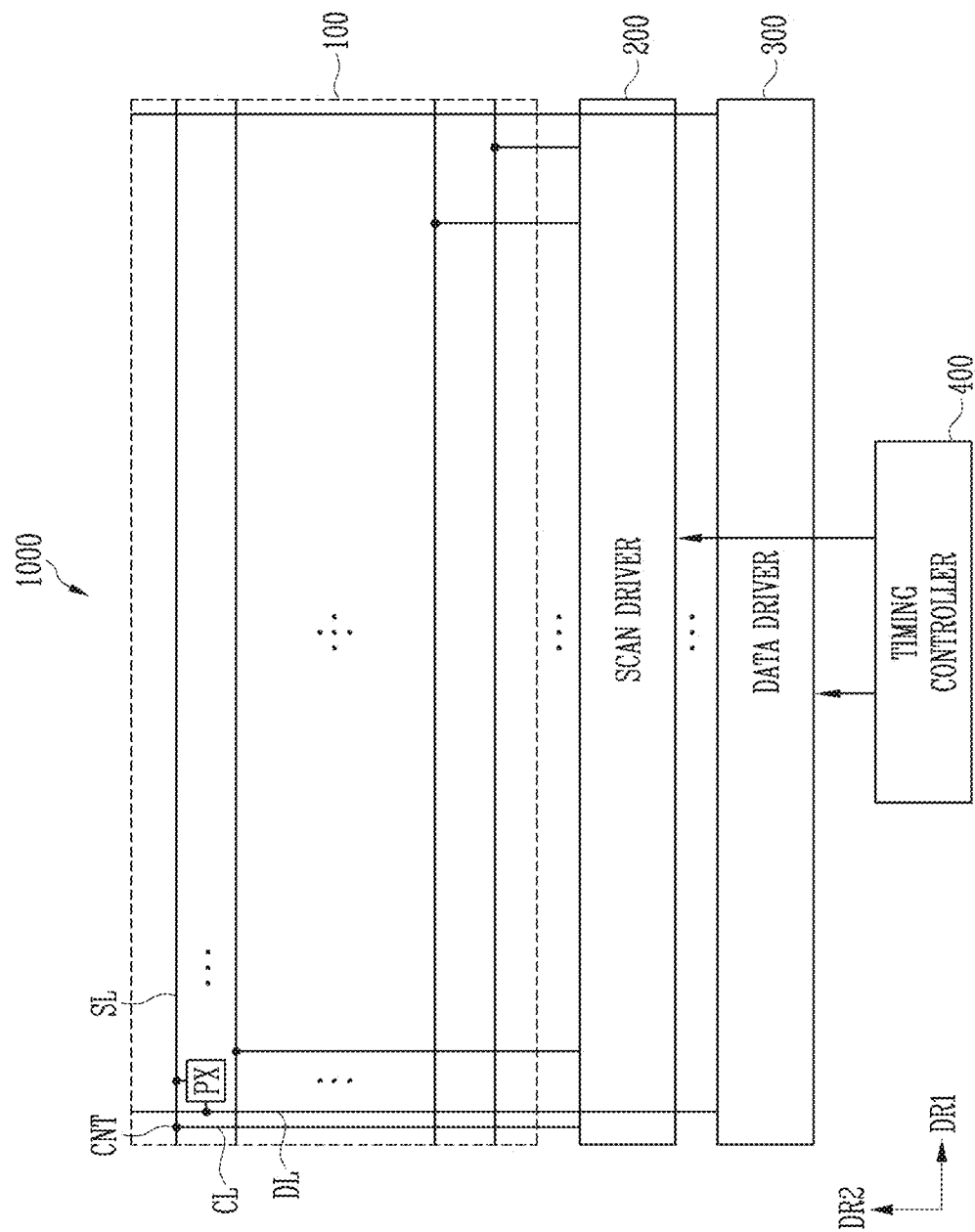
FIG. 1 is a block diagram illustrating a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference to numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Embodiments of the disclosure will hereinafter be described in detail with reference to the accompanying drawings. The same reference numerals are used to designate the same or similar components throughout the drawings, and repeated descriptions thereof will be omitted or simplified.

Figure 2:
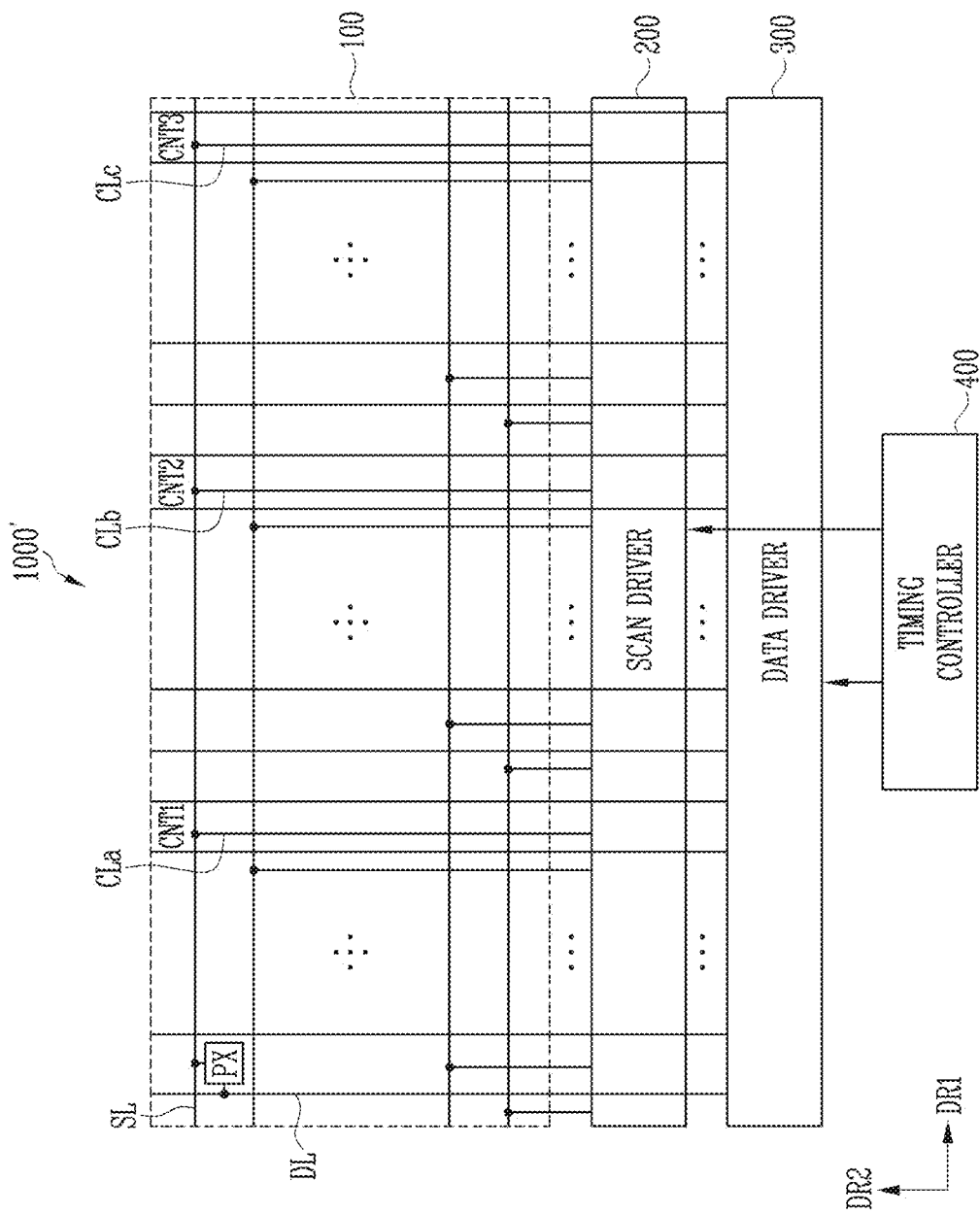
FIG. 2 is a block diagram illustrating an embodiment of the display device of FIG. 1.

FIG. 1 is a block diagram illustrating a display device according to an embodiment of the disclosure, and FIG. 2 is a block diagram illustrating an embodiment of the display device of FIG. 1.

Referring to FIGS. 1 and 2, an embodiment of a display device 1000 or 1000' may include a display panel 100, a scan driver 200, a data driver 300, and a timing controller 400.

An embodiment of the display device 1000 or 1000' may be implemented as a self-emissive display device including a plurality of self-emissive elements. In an embodiment, for example, each of the display device 1000 and 1000' may be an organic light-emitting display device including organic light-emitting elements, a display device including inorganic light-emitting elements, or a display device including light-emitting elements in which an inorganic material and an organic material are combined with each other. However, this is only one embodiment, and alternatively, the display device 1000 or 1000' may be implemented as a liquid crystal display device, a plasma display device, a display device for representing colors using quantum dots, or the like.

An embodiment of the display device 1000 or 1000' may be a flat panel display device, a flexible display device, a curved display device, a foldable display device, or a bendable display device. In such an embodiment, the display device may be applied to a transparent display device, a head-mounted display device, a wearable display device, or the like.

The display panel 100 may include a plurality of pixels PX connected to scan lines SL and data lines DL. An embodiment of the display device 1000 or 1000' may be a display device having a single-side driving structure in which the data driver 300 and the scan driver 200 are arranged together on one side (or a same side) of the display panel 100.

In an embodiment, as illustrated in FIG. 1, scan lines SL may be connected to respective connection lines CL at predetermined contacts CNT (or nodes) to implement the single-side driving structure. In an embodiment, for example, the connection lines CL may be connected to the scan lines SL in one-to-one correspondence.

The scan lines SL may extend in a first direction DR1 (e.g., a pixel row direction or a horizontal direction), and may be connected to pixels PX in pixel rows corresponding to the scan lines SL. Scan signals may be supplied to the pixels PX through the scan lines SL. In such an embodiment, each of the scan lines SL may define a pixel row.

The connection lines CL may extend in a second direction DR2, and may be connected to the scan lines SL at contacts CNT. In an embodiment, for example, the second direction DR2 may be a pixel column direction. The connection lines CL may electrically connect the scan driver 200 to the scan lines SL.

The data lines DL may be connected to the pixels PX on a pixel-column basis. In an embodiment, the data lines DL may extend from the data driver 300 in the second direction DR2, and may electrically connect the pixels PX to the data driver 300.

The scan driver 200 may receive a clock signal, a scan start signal, etc. from the timing controller 400, and may supply scan signals to the scan lines SL. In an embodiment, for example, the scan driver 200 may sequentially supply output signals, which are supplied as scan signals to the scan lines SL, to the connection lines CL.

The data driver 300 may generate data signals based on image data provided from the timing controller 400, and may supply the data signals to the data lines DL. The data driver 300 may apply analog data signals (data voltages) corresponding to digital image data to the data lines DL on a pixel row basis.

The timing controller 400 may receive input image data from an image source such as an external graphics device. The timing controller 400 may generate image data suitable for operation specification of the display panel 100 based on the input image data, and may provide the image data to the data driver 300. Also, the timing controller 400 may generate control signals for controlling the scan driver 200 and the data driver 300 to meet the operation specification of the display panel 100, and may provide the control signals to the scan driver 200 and the data driver 300, respectively.

In an embodiment, at least some components of the scan driver 200 and the data driver 300 may be provided on a circuit board in the form of a chip-on-film ("COF") to implement a single-side driving structure. The scan driver 200 may include a scan signal output circuit, a signal distribution circuit, and a scan-off circuit. In an embodiment, for example, the scan signal output circuit may be included in the chip-on-film, and the signal distribution circuit and the scan-off circuit may be integrated into the display panel 100. The detailed configuration and operation of the scan driver 200 will be described later with reference to FIG. 3.

In an embodiment, as illustrated in FIG. 2, a scan line SL may be connected to a plurality of connection lines CLa, CLb, and CLc at a plurality of contacts CNT1, CNT2, and CNT3, respectively. In an embodiment where a single connection line (e.g., CL of FIG. 1) is connected to each scan line SL, a deviation in the resistor-capacitor ("RC") load (RC delay) of a scan signal may increase depending on the distance to a contact (e.g., CNT). In an embodiment, the scan line SL may be connected to the plurality of connection lines CLa, CLb, and CLc, respectively, which are spaced apart from each other, to reduce such a deviation in the RC load. in an embodiment, as shown in FIG. 2, one scan line SL may be connected to three connection lines CLa, CLb, and CLc, but the disclosure is not limited thereto. In an alternative embodiment, the timing of scan signals provided through the connection lines CLa, CLb, and CLc may be substantially identical or similar to each other.

Figure 3:
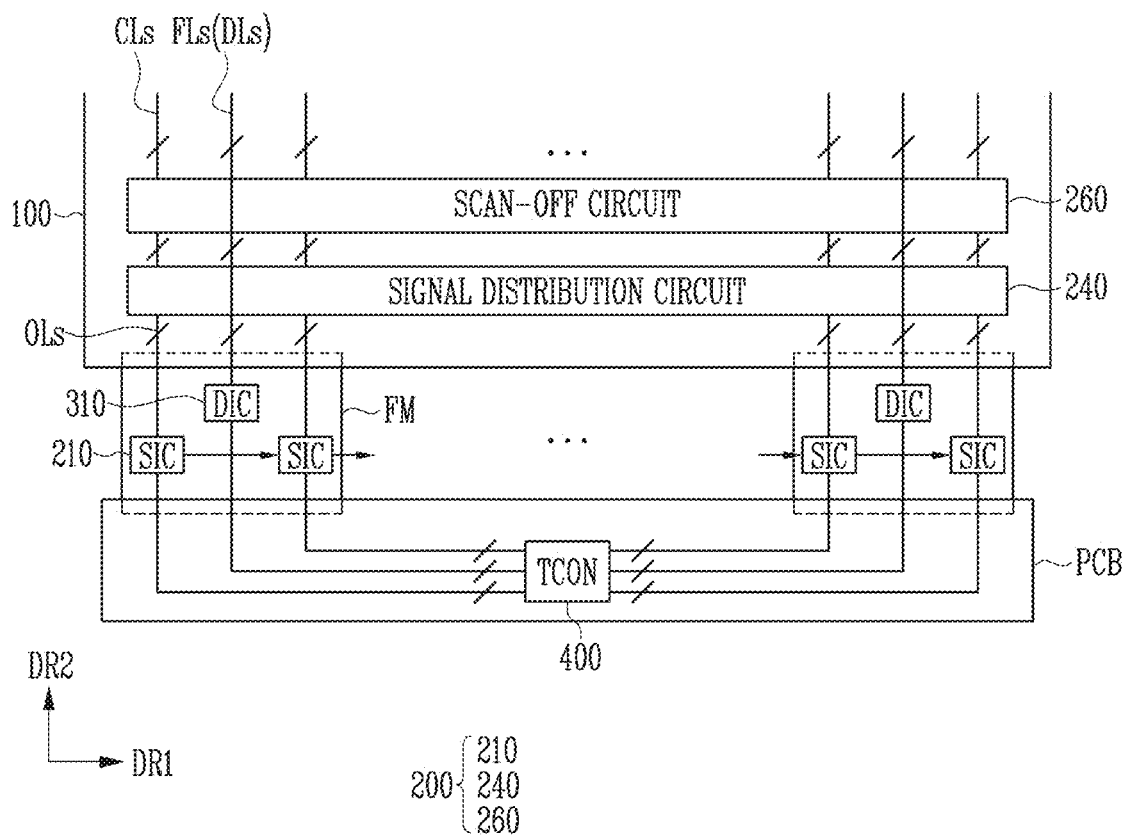
FIG. 3 is a block diagram illustrating an embodiment of a portion of the display device of FIG. 1.

FIG. 3 is a block diagram illustrating an embodiment of a portion of the display device of FIG. 1.

Referring to FIGS. 1 and 3, an embodiment of the display device 1000 may include a display panel 100, a scan driver 200, a data driver 300, and a timing controller (TCON in FIG. 3) 400.

In an embodiment, the scan driver 200 may include a scan driver circuit 210 having a scan signal output circuit, a signal distribution circuit 240, and a scan-off circuit 260.

The scan driver circuit 210 may include or be composed of a plurality of scan driver chips (e.g., indicated by "SIC"), and may be arranged on a flexible film FM in the form of a chip-on-film. In such an embodiment, each scan driver chip SIC may be connected to a plurality of output lines OLs, and may be involved in the output of the connection lines CLs associated with the output lines. The flexible film FM may be physically connected to the display panel 100. In an embodiment, for example, output signals of the scan driver circuit 210 may be supplied to the output lines OLs provided to the display panel 100 through pads.

In such an embodiment, a plurality of flexible films FM in which scan driver chips SIC are mounted may be provided in the display device 1000. In each flexible film FM, at least one scan driver chip SIC may be mounted.

In an embodiment, the scan driver circuit 210 may include shift registers, and may sequentially output shifted signals of an input signal as scan signals. In an embodiment, for example, the final output of one scan driver chip may be provided as the input of an adjacent scan driver chip (i.e., a subsequent scan driver chip).

The signal distribution circuit 240 and the scan-off circuit 260 may be integrated into the display panel 100. In an embodiment, each of the signal distribution circuit 240 and the scan-off circuit 260 may include a plurality of transistors.

In an embodiment, the signal distribution circuit 240 and the scan-off circuit 260 may be arranged in a non-display area (or a peripheral area or a bezel) of the display panel 100 in which pixels PX are not arranged. In an embodiment, at least some components of the signal distribution circuit 240 and the scan-off circuit 260 may be arranged in a display area. In an embodiment, for example, the signal distribution circuit 240 and the scan-off circuit 260 may be disposed or formed between pixel circuits the pixels PX on a backplane on which the pixel circuits are implemented.

The signal distribution circuit 240 may provide output signals (e.g., scan signals), provided from the output lines OLs, to some of the connection lines CLs in response to a distribution control signal. In an embodiment, for example, the signal distribution circuit 240 may perform an operation such as that of a 1:k demultiplexer (where k is an integer greater than 1).

The scan-off circuit 260 may output (or change) at least one of the output signals, provided from the signal distribution circuit 240, at a gate-off level in response to a control signal. In an embodiment, for example, the scan-off circuit 260 may control the voltages of output signals that are supplied to connection lines CLs, which are connected to scan lines to which scan signals are not be supplied, among the connection lines CLs, to gate-off levels.

The data driver 300 may be provided, together with the scan driver circuit 210, on one side (or a same side) of the display panel 100. In an embodiment, the data driver 300 may include a chip-on-film-type data driver circuit 310 (or a data driver chip). The data driver circuit 310 may be implemented using a plurality of data driver chips (DIC in FIG. 3). One data driver chip DIC may be electrically connected to a plurality of fan-out lines FLs and data lines DLs connected thereto. In an embodiment, for example, the data driver chip DIC may be connected to fan-out lines FLs corresponding to the data lines DLs through the flexible film FM and/or the pads provided in the display panel 100.

In each flexible film FM, at least one data driver chip DIC may be mounted.

In an embodiment, the scan driver chip SIC and the data driver chip DIC may be mounted on the flexible film FM as separate components. In an embodiment, for example, the scan driver chip SIC and the data driver chip DIC may be arranged not to overlap each other in the flexible film FM in the second direction DR2 so that lines connected to the scan driver chip SIC and lines connected to the data driver chip DIC are not shorted to each other. However, this is only one embodiment, and the arrangement and configuration of the scan driver chip SIC and the data driver chip DIC are not limited thereto.

In an embodiment, the timing controller 400 may be mounted on a printed circuit board ("PCB") or a printed circuit film having flexibility in the form of a chip-on-film. The timing controller 400 may be connected to the scan driver chip SIC and the data driver chip DIC through a plurality of lines, and may control driving of the scan driver chip SIC and the data driver chip DIC. The PCB may be physically connected to the flexible film FM.

However, this is only an embodiment, and at least some of functions of the timing controller 400 may be included in at least one selected from the scan driver chip SIC and the data driver chip DIC. Alternatively, a component for performing the function of the timing controller 400 may be included in the flexible film FM. In such an embodiment, the PCB may be omitted.

Figure 4:
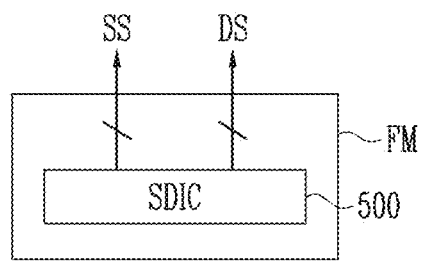
FIG. 4 is a diagram illustrating an embodiment of a driver chip included in the display device of FIG. 1.

FIG. 4 is a diagram illustrating an embodiment of a driver chip included in the display device of FIG. 1.

Referring to FIGS. 1, 3, and 4, a driver chip 500 included in the display device 1000 may be mounted on a flexible film FM.

In an embodiment, the driver chip (SDIC in FIG. 4) 500 may include both the function of the scan driver chip SIC and the function of the data driver chip DIC, described above with reference to FIG. 3. In an embodiment, for example, the driver chip 500 may output scan signals SS based on the function of the scan driver chip SIC, and may output data signals DS based on the function of the data driver chip DIC.

Accordingly, the display device 1000 may have a single-side driving structure in which the scan driver chip SIC of the scan driver 200 and the data driver chip DIC of the data driver 300 are provided on one side (or a same side) of the display panel 100.

Figure 5:
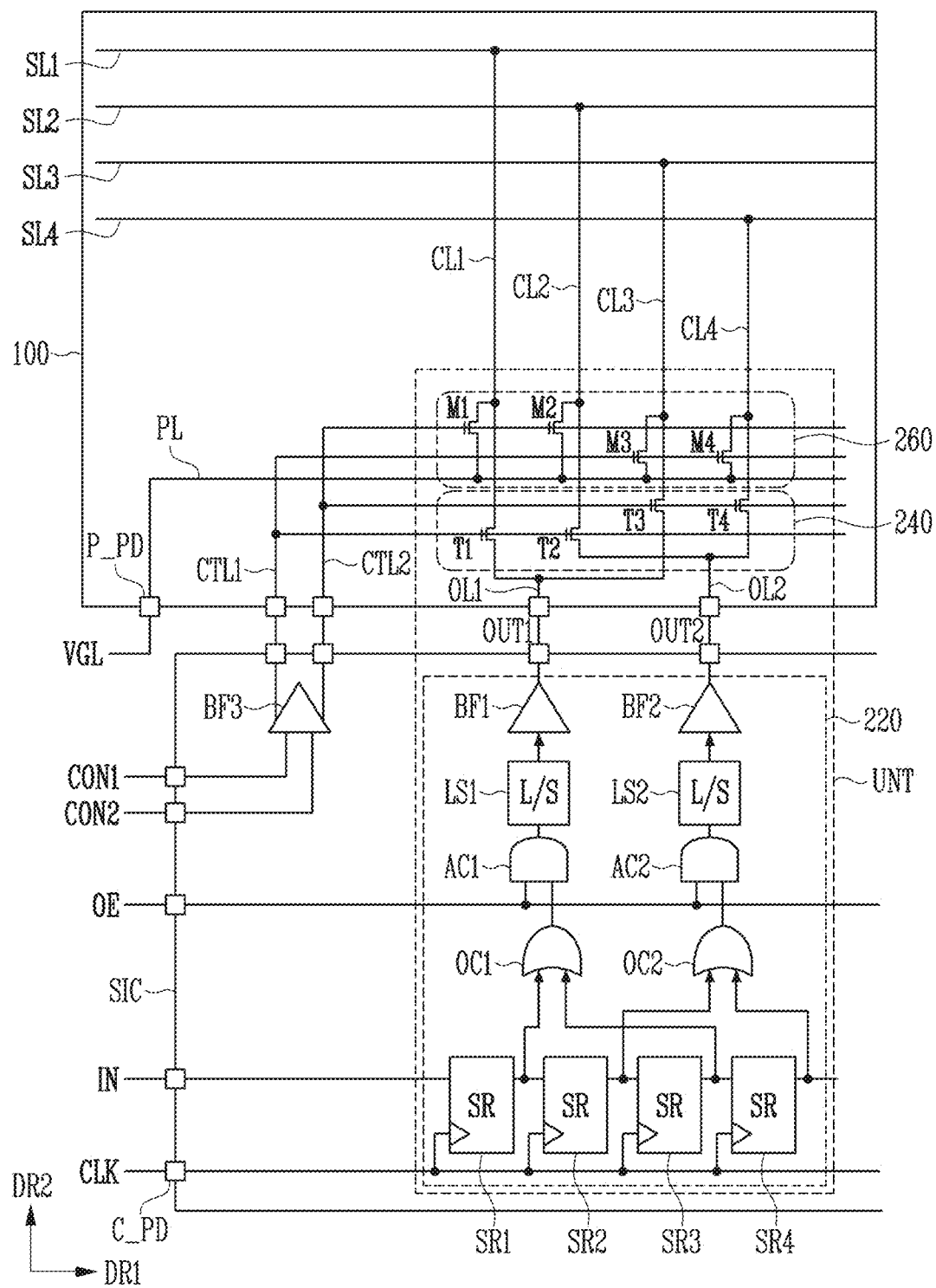
FIG. 5 is a diagram illustrating an embodiment of a scan driver included in the display device of FIG. 1.

FIG. 5 is a diagram illustrating an embodiment of the scan driver included in the display device of FIG. 1.

Referring to FIGS. 3 and 5, in an embodiment, the scan driver 200 may include a scan signal output circuit 220, a signal distribution circuit 240, and a scan-off circuit 260.

In FIG. 5, a basic unit UNT of the scan driver 200 which outputs scan signals to first to fourth scan lines SL1 to SL4 is illustrated, and the scan driver 200 may have a form in which a component substantially identical or similar to the basic unit UNT of the scan driver 200 is repeated. In such an embodiment, the basic unit UNT may be driven in a same manner as a 1:2 demultiplexer, and may provide the scan signals to the first to fourth scan lines SL1 to SL4. However, this is only one embodiment, and demultiplexing driving of the basic unit UNT is not limited thereto. Alternatively, the demultiplexing driving may be extended in various manners, such as 1:4 or 1:8 demultiplexing.

Hereinafter, an embodiment where the scan driver 200 performs 1:2 demultiplexing driving will be described in detail with reference to FIGS. 5 to 7.

The scan signal output circuit 220 may be included in a scan driver chip SIC. The scan driver chip SIC may include a plurality of chip pads C_PD which receive various signals supplied from the timing controller 400 and provide predetermined signals to the display panel 100.

The scan signal output circuit 220 may output a first output signal OUT1 as a scan signal to a first output line OL1 and output a second output signal OUT2 as a scan signal to a second output line OL2. In an embodiment, for example, the first output signal OUT1 may be a first scan signal to be provided to a first scan line SL1 or a third scan signal to be provided to a third scan line SL3, and the second output signal OUT2 may be a second scan signal to be provided to a second scan line SL2 or a fourth scan signal to be provided to a fourth scan line SL4. The first to fourth scan lines SL1 to SL4 may be sequentially arranged in a second direction DR2.

In an embodiment, the scan signal output circuit 220 may include shift registers, e.g., first to fourth shift registers SR1, SR2, SR3, and SR4, logic OR circuits, e.g., first and second logic OR circuits OC1 and OC2, logic AND circuits, e.g., first and second logic AND circuits AC1 and AC2, level shifters (L/S in FIG. 5), e.g., first and second level shifters LS1 and LS2, and buffers, e.g., first and second buffers BF1 and BF2.

The shift registers SR1, SR2, SR3, and SR4 may be dependently (e.g., cascadedly) connected to each other. The shift registers SR1, SR2, SR3, and SR4 may sequentially output modified signals of an input signal IN based on a clock signal CLK.

The first shift register SR1 may shift and output the input signal IN based on the clock signal CLK. The output of the first shift register SR1 may be provided to the second shift register SR2 and the first logic OR circuit OC1.

The second shift register SR2 may be dependently connected to the first shift register SR1. The second shift register SR2 may shift and output the output of the first shift register SR1 based on the clock signal CLK. The output of the second shift register SR2 may be provided to the third shift register SR3 and the second logic OR circuit OC2.

The third shift register SR3 may be dependently connected to the second shift register SR2. The third shift register SR3 may shift and output the output of the second shift register SR2 based on the clock signal CLK. The output of the third shift register SR3 may be provided to the fourth shift register SR4 and the first logic OR circuit OC1.

The fourth shift register SR4 may be dependently connected to the third shift register SR3. The fourth shift register SR4 may shift and output the output of the third shift register SR3 based on the clock signal CLK. The output of the fourth shift register SR4 may be provided to a fifth shift register SR5 and the second logic OR circuit OC2.

In an embodiment, the amount of shift of each of the signals output from the shift registers SR1, SR2, SR3, and SR4 may be substantially the same as the period of the clock signal CLK. The shift registers SR1, SR2, SR3, and SR4 may be implemented using various well-known hardware circuits or modifications thereof.

Each of the first and second logic OR circuits OC1 and OC2 may generate a first intermediate signal using the outputs of two non-adjacent shift registers, among the shift registers SR1, SR2, SR3, and SR4. In an embodiment, for example, the first logic OR circuit OC1 may perform a logic OR operation on the outputs of the first and third shift registers SR1 and SR3, and the second logic OR circuit OC2 may perform a logic OR operation on the outputs of the second and fourth shift registers SR2 and SR4.

When at least one of the outputs of the first and third shift registers SR1 and SR3 has a gate-on level, the first logic OR circuit OC1 may output a signal having a gate-on level as a first intermediate signal. When both the outputs of the first and third shift registers SR1 and SR3 have a gate-off level, the first logic OR circuit OC1 may output a signal having a gate-off level.

In an embodiment, for example, where N-type transistors are driven, the gate-on level may be a logic high level. In an embodiment, where P-type transistors are driven, the gate-on level may be a logic low level.

In an embodiment, when at least one of the outputs of the second and fourth shift registers SR2 and SR4 has a gate-on level, the second logic OR circuit OC2 may output a signal having a gate-on level as a first intermediate signal. When both the outputs of the second and fourth shift registers SR2 and SR4 have a gate-off level, the second logic OR circuit OC2 may output a signal having a gate-off level.

In an embodiment, for example, the first logic OR circuit OC1 may output a signal having a gate-on level corresponding to the outputs of the first and third shift registers SR1 and SR3. The second logic OR circuit OC2 may output a signal having a gate-on level corresponding to the outputs of the second and fourth shift registers SR2 and SR4.

The first and second logic OR circuits OC1 and OC2 may be implemented using various well-known hardware circuits and/or software.

Each of the first and second logic AND circuits AC1 and AC2 may generate a second intermediate signal using the output of a corresponding one of the first and second logic OR circuits OC1 and OC2 (first intermediate signal) and an output enable signal OE. The output enable signal OE may be supplied from the timing controller 400. The output enable signal OE may determine the output timing of a scan signal having a gate-on level.

In an embodiment, the first logic AND circuit AC1 may perform a logic AND operation on the output of the first logic OR circuit OC1 and the output enable signal OE. When both the output of the first logic OR circuit OC1 and the output enable signal OE have a gate-on level, the first logic AND circuit AC1 may output a signal having a gate-on level as the second intermediate signal. When at least one of the output of the first logic OR circuit OC1 and the output enable signal OE has a gate-off level, the first logic AND circuit AC1 may output a signal having a gate-off level as the second intermediate signal.

In an embodiment, the second logic AND circuit AC2 may perform a logic AND operation on the output of the second logic OR circuit OC2 and the output enable signal OE. When both the output of the second logic OR circuit OC2 and the output enable signal OE have a gate-on level, the second logic AND circuit AC2 may output a signal having a gate-on level as the second intermediate signal.

The first and second logic AND circuits AC1 and AC2 may be implemented using various well-known hardware circuits and/or software.

Each of the first and second level shifters LS1 and LS2 may adjust the voltage level of the second intermediate signal to correspond to a high level or a low level of a scan signal. The first and second level shifters LS1 and LS2 may be implemented using various well-known hardware circuits and/or software. In an embodiment, for example, a high level of a scan signal may be a gate-on level of the scan signal, and a low level of the scan signal may be a gate-off level of the scan signal.

The first level shifter LS1 may receive the output of the first logic AND circuit AC1. In an embodiment, for example, the first level shifter LS1 may adjust the gate-on level of the output of the first logic AND circuit AC1 to a degree corresponding to the high level of the scan signal, and may adjust the gate-off level of the output of the first logic AND circuit AC1 to a degree corresponding to the low level of the scan signal.

Since the operation of the second level-shifter LS2 is substantially the same as that of the first level shifter, repeated descriptions thereof will be omitted.

The first and second buffers BF1 and BF2 may provide the outputs of the first and second level shifters LS1 and LS2 to the first output line OL1 and the second output line OL2, respectively. The first and second buffers BF1 and BF2 may be implemented using various well-known hardware circuits and/or software. In an embodiment, for example, each of the first and second buffers BF1 and BF2 may be implemented as an amplifier circuit including transistors.

The first output signal OUT1 may be output by the first buffer BF1 to the first output line OL1, and the second output signal OUT2 may be output by the second buffer BF2 to the second output line OL2.

In such an embodiment of the scan signal output circuit 220, the first output signal OUT1 may include the first scan signal or the third scan signal, and the second output signal OUT2 may include the second scan signal or the fourth scan signal.

The signal distribution circuit 240 and the scan-off circuit 260 may be integrated into the display panel 100. The display panel 100 may include a plurality of panel pads P_PD which receive signals provided from the scan driver chip SIC or the flexible film FM including the scan driver chip SIC. In an embodiment, for example, the panel pads P_PD may be connected to the first output line OL1, the second output line OL2, a first signal line CTL1, a second signal line CTL2, a power line PL for transferring a low voltage VGL having a gate-off level, etc.

The signal distribution circuit 240 may provide the first output signal OUT1 to the first connection line CL1 or the third connection line CL3 and provide the second output signal OUT2 to the second connection line CL2 or the fourth connection line CL4 in response to a first distribution control signal and a second distribution control signal.

The scan-off circuit 260 may output at least one of the first output signal OUT1 and the second output signal OUT2, provided from the signal distribution circuit 240, as a signal having a gate-off level in response to first and second scan-off control signals. The gate-off level output by the scan-off circuit 260 may be a gate-off level (e.g., low level) of a scan signal.

In an embodiment, the second distribution control signal may be an inverted signal of the first distribution control signal. In such an embodiment, the first distribution control signal and the second scan-off control signal may be a same signal that is provided to the same first signal line CTL1. In such an embodiment, the second distribution control signal and the first scan-off control signal may be a same signal that is provided to the same second signal line CTL2.

Figure 6:
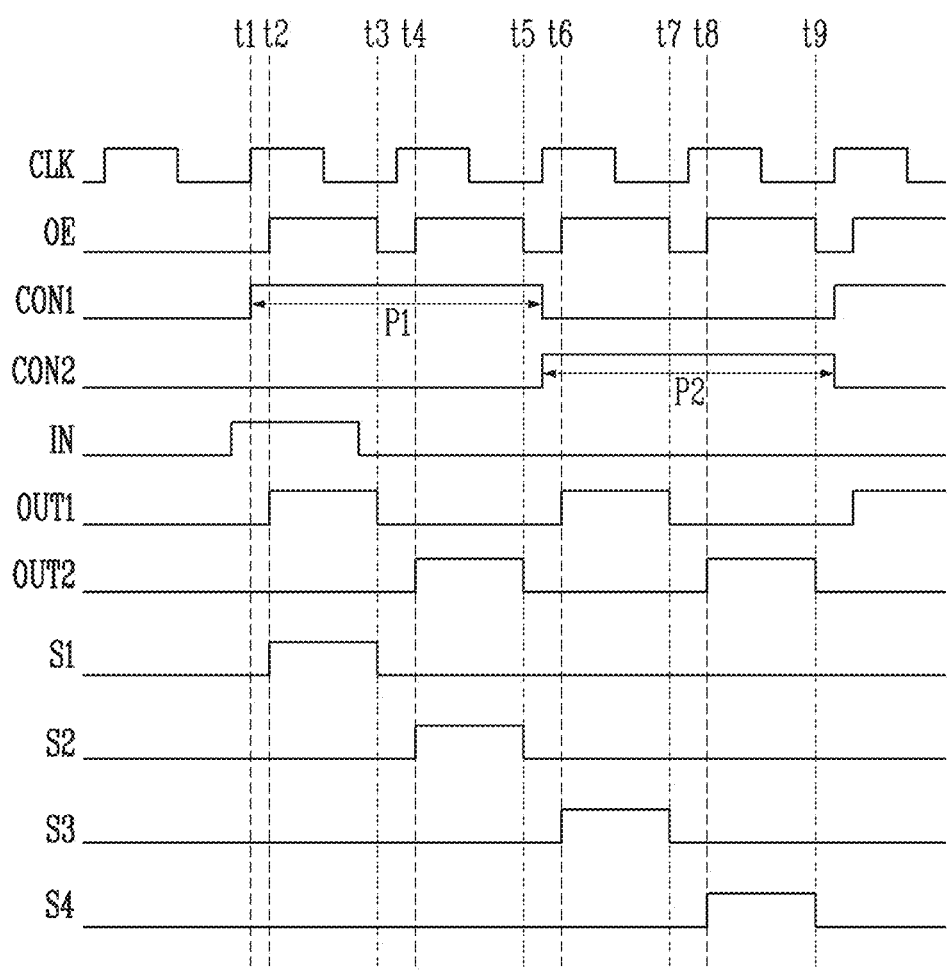
FIG. 6 is a signal timing diagram illustrating an embodiment of the operation of the scan driver of FIG. 5.
Figure 7:
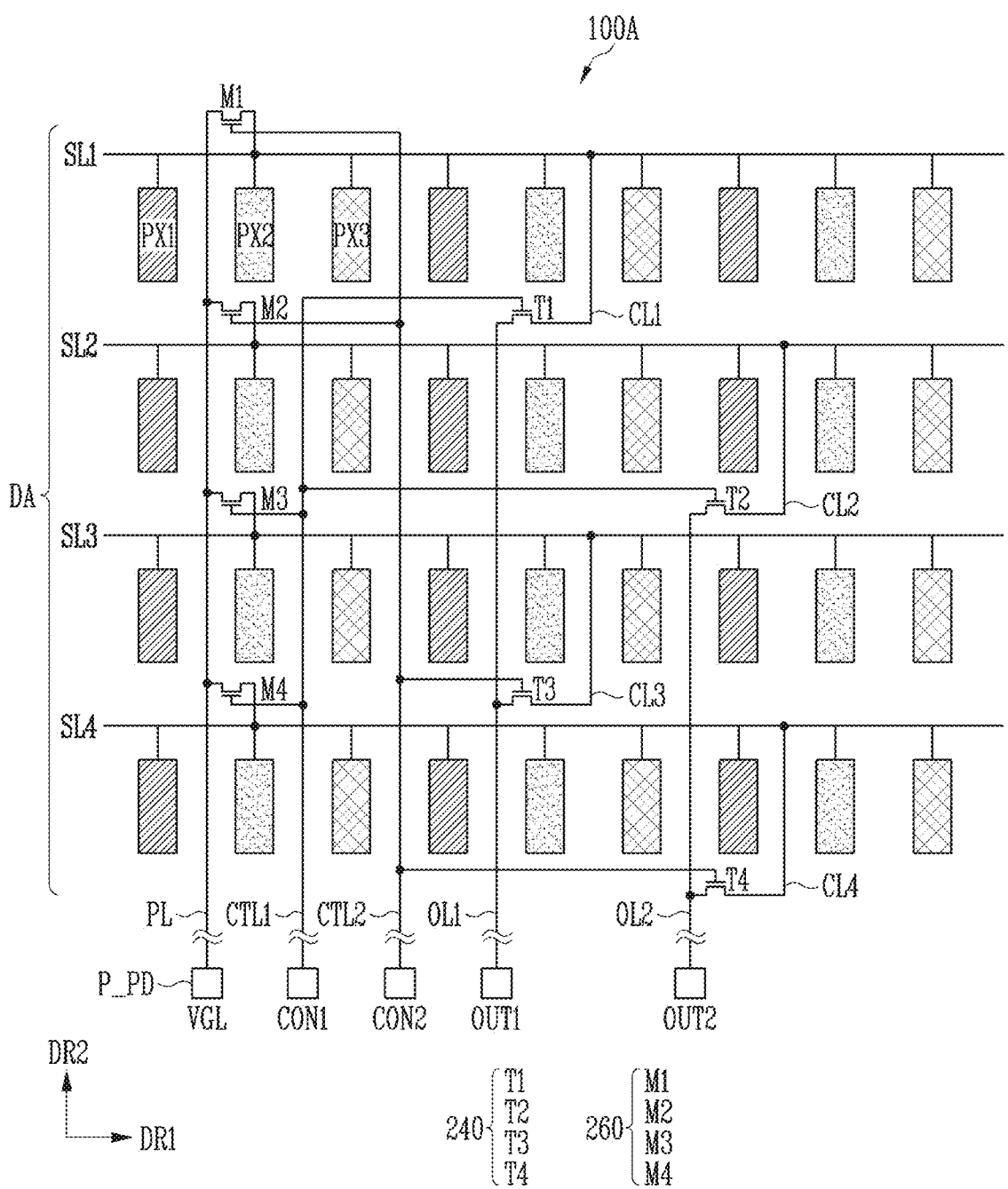
FIG. 7 is a diagram illustrating an embodiment of a display panel included in the display device of FIG. 1.

In FIGS. 5 to 7, an embodiment where a first control signal CON1 corresponds to the first distribution control signal and the second scan-off control signal and that a second control signal CON2 corresponds to the second distribution control signal and the first scan-off control signal is illustrated. In an embodiment, for example, the second control signal CON2 may be an inverted signal of the first control signal CON1.

In an embodiment, the first control signal CON1 and the second control signal CON2 may be provided from the timing controller 400 to the display panel 100 via the scan driver chip SIC. In an embodiment, for example, the scan driver chip SIC may include a third buffer BF3 which controls or buffers the output of the first and second control signals CON1 and CON2. The first control signal CON1 and the second control signal CON2 may be provided to the first signal line CTL1 and the second signal line CTL2, respectively.

However, this is only one embodiment, and the first control signal CON1 and the second signal CON2 may be provided to the signal distribution circuit 240 and the scan-off circuit 260 of the display panel 100 through the flexible film FM without passing through the scan driver chip SIC.

In an embodiment, the signal distribution circuit 240 may include first to fourth transistors T1 to T4. The first to fourth transistors T1 to T4 may perform demultiplexing on scan signals.

The first transistor T1 may be connected between the first output line OL1 and the first connection line CL1. The first transistor T1 may be turned on in response to the first control signal CON1. When the first transistor T1 is turned on, the first output signal OUT1 may be provided as a first scan signal to the first scan line SL1 through the first connection line CL1.

The second transistor T2 may be connected between the second output line OL2 and the second connection line CL2. The second transistor T2 may be turned on in response to the first control signal CON1. When the second transistor T2 is turned on, the second output signal OUT2 may be provided as a second scan signal to the second scan line SL2 through the second connection line CL2.

The third transistor T3 may be connected between the first output line OL1 and the third connection line CL3. The third transistor T3 may be turned on in response to the second control signal CON2. When the third transistor T3 is turned on, the first output signal OUT1 may be provided as a third scan signal to the third scan line SL3 through the third connection line CL3.

The fourth transistor T4 may be connected between the second output line OL2 and the fourth connection line CL4. The fourth transistor T4 may be turned on in response to the second control signal CON2. When the fourth transistor T4 is turned on, the second output signal OUT2 may be provided as a fourth scan signal to the fourth scan line SL4 through the fourth connection line CL4.

The first transistor T1 and the second transistor T2 may be simultaneously turned on, and the third transistor T3 and the fourth transistor T4 may be simultaneously turned on.

In an embodiment, the scan-off circuit 260 may include first to fourth off transistors M1 to M4.

The first off transistor M1 may be connected between the power line PL and the first scan line SL1. In an embodiment, the first off transistor M1 may be directly connected between the power line PL and the first connection line CL1. The first off transistor M1 may be turned on in response to the second control signal CON2. When the first off transistor M1 is turned on, a low voltage VGL may be supplied to the first scan line SL1 through the first connection line CL1. That is, the first scan signal may have the low voltage VGL.

The second off transistor M2 may be connected between the power line PL and the second scan line SL2. In an embodiment, the second off transistor M2 may be directly connected between the power line PL and the second connection line CL2. The second off transistor M2 may be turned on in response to the second control signal CON2. When the second off transistor M2 is turned on, the low voltage VGL may be supplied to the second scan line SL2 through the second connection line CL2.

The third off transistor M3 may be connected between the power line PL and the third scan line SL3. In an embodiment, the third off transistor M3 may be directly connected between the power line PL and the third connection line CL3. The third off transistor M3 may be turned on in response to the first control signal CON1. When the third off transistor M3 is turned on, the low voltage VGL may be supplied to the third scan line SL3 through the third connection line CL3.

The fourth off transistor M4 may be connected between the power line PL and the fourth scan line SL4. In an embodiment, the fourth off transistor M4 may be directly connected between the power line PL and the fourth connection line CL4. The fourth off transistor M4 may be turned on in response to the first control signal CON1. When the fourth off transistor M4 is turned on, the low voltage VGL may be supplied to the fourth scan line SL4 through the fourth connection line CL4.

In an embodiment, when the first transistor T1 is turned on, the first off transistor M1 may be turned off. In an embodiment, for example, switching of the first transistor T1 and the first off transistor M1 may be performed in reverse. In such an embodiment, switching of the second to fourth transistors T2 to T4 and the second to fourth off transistors M2 to M4 may be respectively performed in reverse.

In an embodiment of the display device 1000 including the scan driver chip SIC, as described above, the signal distribution circuit 240 for performing demultiplexing may be integrated into the display panel 100, and thus a dead space in the display panel 100 may be reduced, and a narrow bezel may be implemented together in the display panel 100. In such an embodiment, since the signal distribution circuit 240 is integrated into the display panel 100, the number of panel pads P_PD and chip pads C_PD and the size of the scan driver chip SIC may be reduced, such that manufacturing costs may be decreased.

In such an embodiment, the scan-off circuit 260 may maintain signals that are supplied to inactive scan lines at the low voltage VGL, thus preventing malfunction of the pixel PX from occurring.

In such an embodiment, since non-adjacent scan lines share respective output lines OL1 and OL2 with each other, timing at which each scan signal sinks may occur due to an output signal having a gate-off level, output from the scan signal output circuit 220, rather than due to the low voltage VGL supplied from the power line PL. In an embodiment, for example, odd-numbered scan lines SL1 and SL3 may share the first output line OL1 with each other, and even-numbered scan lines SL2 and SL4 may share the second output line OL2 with each other.

In such an embodiment, sinking of scan signals by the output of the scan signal output circuit 220 may be more effectively performed than that of scan signals by the operation of the scan-off circuit 260. Therefore, a kickback failure that occurs when the transistor (e.g., switching transistor) of the pixel PX is turned off due to interruption of supply of scan signals may be reduced.

FIG. 6 is a signal timing diagram illustrating an embodiment of the operation of the scan driver of FIG. 5.

Referring to FIGS. 3, 5, and 6, in an embodiment, the scan driver 200 may demultiplex the first output signal OUT1 and the second output signal OUT2, and may then sequentially output first to fourth scan signals S1 to S4 to the first to fourth scan lines SL1 to SL4.

Hereinafter, an embodiment where a gate-on level of signals is a high level and a gate-off level thereof is a low level will be described in detail, where the terms may be used interchangeably with each other. Herein, the expression "scan signal/input signal/output signal are output/provided" means that "gate-on level (high level) of scan signal/input signal/output signal is output/provided". In an embodiment, gate-on levels (or gate-off levels) of respective signals may be substantially identical to each other. In an alternative embodiment, at least one of gate-on levels (or gate-off levels) of respective signals may be a voltage level different from other gate-on levels (or gate-off levels).

After an input signal IN having a gate-on level is supplied, a clock signal CLK having a gate-on level may be supplied at a first time point t1. The first to fourth shift registers SR1 to SR4 may sequentially output modified signals of the input signal IN based on the clock signal CLK.

In an embodiment, the first output signal OUT1 and the second output signal OUT2 may be output at a gate-on level in response to the output enable signal OE. At a second time point t2, the output enable signal OE may make a transition to a gate-on level, and the first output signal OUT1 having a gate-on level, corresponding to the output of the first shift register SR1, may be output. The first output signal OUT1 having a gate-on level may be maintained up to a third time point t3.

At the third time point t3, the output enable signal OE may make a transition to a gate-off level, and the first output signal OUT1 may change to the gate-off level in response to the output enable signal OE.

At a fourth time point t4, the output enable signal OE may again make a transition to a gate-on level, and the second output signal OUT2 having a gate-on level, corresponding to the output of the second shift register SR2, may be output. The second output signal OUT2 having a gate-on level may be maintained up to a fifth time point t5.

At the fifth time point t5, the output enable signal OE may make a transition to a gate-off level, and the second output signal OUT2 may change to a gate-off level.

In an embodiment, the cycle of the output enable signal OE may correspond to an interval at which adjacent scan signals are output. In such an embodiment, the gate-on level period of the output enable signal OE may correspond to the pulse width of the scan signals S1 to S4.

In an embodiment, during a first period P1 after the first time t1 and before a sixth time point t6, the first control signal CON1 may have a gate-on level. During the first period P1, the first and second transistors T1 and T2 and the third and fourth off transistors M3 and M4 may be turned on in response to the first control signal CON1.

Therefore, during the first period P1, the first scan signal S1 may be output in response to the first output signal OUT1, and the second scan signal S2 may be output in response to the second output signal OUT2. During the first period P1, the third scan signal S3 and the fourth scan signal S4 may be stably maintained at a low voltage VGL supplied from the power line PL.

In an embodiment, at the third time point t3, the first output signal OUT1 makes a transition to a gate-off level, and thus the first scan signal S1 may make a transition to a gate-off level. In such an embodiment, the first scan signal S1 may fall (sink) to a gate-off level through the operation of the scan driver chip SIC including the scan signal output circuit 220, rather than the operation of the scan-off circuit 260. In such an embodiment, the first scan signal S1 may drop to the gate-off level depending on variation in the waveform of the first output signal OUT1. Therefore, a kickback failure that occurs when the transistor (e.g., switching transistor) of the pixel PX is turned off due to interruption of supply of the first scan signal S1 may be reduced. In an embodiment, for example, it is desired to drop (fall) the first scan signal S1 depending on the variation in the waveform of the first output signal OUT1, compared to pulling-down of the first scan signal S1 through the first off transistor M1, from the standpoint of kickback prevention/reduction.

In such an embodiment, at the fifth time point t5, the second output signal OUT2 makes a transition to a gate-off level, and thus the second scan signal S2 may make a transition to a gate-off level.

Thereafter, at the sixth time point t6, the output enable signal OE may make a transition to a gate-on level, and the first output signal OUT1 having a gate-on level, corresponding to the output of the third shift register SR3, may be output. The first output signal OUT1 having a gate-on level may be maintained up to a seventh time point t7.

At the seventh time point t7, the output enable signal OE may make a transition to a gate-off level, and the first output signal OUT1 may change to the gate-off level in response to the output enable signal OE.

At an eighth time point t8, the output enable signal OE may again make a transition to a gate-on level, and the second output signal OUT2 having a gate-on level, corresponding to the output of the fourth shift register SR4, may be output. The second output signal OUT2 having a gate-on level may be maintained up to a ninth time point t9.

At the ninth time point t9, the output enable signal OE may make a transition to a low level, and the second output signal OUT2 may change to a gate-off level.

In an embodiment, during a second period P2 after the fifth time point t5, the second signal CON2 may have a high level. During the second period P2, the third and fourth transistors T3 and T4 and the first and second off transistors M1 and M2 may be turned on in response to the second control signal CON2.

Therefore, the third scan signal S3 may be output in response to the first output signal OUT1, and the fourth scan signal S4 may be output in response to the second output signal OUT2.

Since a basic operation from the sixth time point t6 to the ninth time point t9 may be similar to that from the first time point t1 to the fifth time point t5, repeated descriptions thereof will be omitted.

In such an embodiment, the display device 1000 having a narrow bezel and a single-side driving structure may be implemented through demultiplexing driving of output of scan signals. In such an embodiment, the scan-off circuit 260 may maintain signals that are supplied to inactive scan lines at the low voltage VGL, thus preventing malfunction of the pixel PX from occurring.

In such an embodiment, since demultiplexing is separately performed on non-adjacent scan lines (e.g., the first scan line S1 and the third scan line S3), pulling-down of scan signals may be effectively performed by the scan signal output circuit 220, rather than by the scan-off circuit 260. Therefore, occurrence of kickback failures may be reduced.

FIG. 7 is a diagram illustrating an embodiment of the display panel included in the display device of FIG. 1.

In FIG. 7, the same reference numerals are assigned to the same or similar components described with reference to FIG. 5, and any repetitive detailed descriptions thereof will be omitted.

Referring to FIGS. 1, 3, and 5, in an embodiment, the signal distribution circuit 240 and the scan-off circuit 260 of the scan driver 200 may be integrated into a display panel 100A.

In a display area DA of the display panel 100A, pixels PX1, PX2, and PX3 which emit light of different colors may be sequentially arranged in the first direction DR1. In an embodiment, for example, the pixels PX1, PX2, and PX3 may emit light in different colors. However, the array of the pixels PX1, PX2, and PX3 illustrated in FIG. 7 is only one embodiment, and the pixels PX1, PX2, and PX3 may be arranged in various structures depending on the purpose of design.

The pixels PX1, PX2, and PX3 connected to the first scan line SL1 may form a first pixel row, and the pixels PX1, PX2, and PX3 connected to the second scan line SL2 may form a second pixel row. The pixels PX1, PX2, and PX3 connected to the third scan line SL3 may form a third pixel row, and the pixels PX1, PX2, and PX3 connected to the fourth scan line SL4 may form a fourth pixel row.

In an embodiment, the signal distribution circuit 240 and the scan-off circuit 260 may be disposed or formed in a display area DA in which the pixels PX1, PX2, and PX3 are arranged. At least some of first to fourth transistors T1 to T4 and first to fourth off transistors M1 to M4 may be arranged in the display area DA. In an embodiment, for example, at least some of the first to fourth transistors T1 to T4 and the first to fourth off transistors M1 to M4 may be respectively disposed or formed between pixel circuits of the pixels PX1, PX2, and PX3 disposed on a base substrate.

As illustrated in FIG. 7, a low voltage VGL, a first control signal CON1, a second control signal CON2, a first output signal OUT1, and a second output signal OUT2 may be provided to the display panel 100A through respective panel pads P_PD. The low voltage VGL may be transferred to the power line PL, the first control signal CON1 may be transferred to the first signal line CTL1, the second control signal CON2 may be transferred to the second signal line CTL2, the first output signal OUT1 may be transferred to the first output line OL1, and the second output signal OUT2 may be transferred to the second output line OL2. The power line PL, the first signal line CTL1, the second signal line CTL2, the first output line OL1, and the second output line OL2 may extend to the display area DA in a second direction DR2.

The first transistor T1 may be connected between the first output line OL1 and the first connection line CL1 in the display area DA. The second transistor T2 may be connected between the second output line OL2 and the second connection line CL2 in the display area DA. The third transistor T3 may be connected between the first output line OL1 and the third connection line CL3 in the display area DA. The fourth transistor T4 may be connected between the second output line OL2 and the fourth connection line CL4 in the display area DA.

The first to fourth off transistors M1 to M4 may be respectively connected between the power line PL and the first to fourth scan lines SL1 to SL4 in the display area DA.

Gate electrodes of the first transistor T1, the second transistor T2, the third off transistor M3, and the fourth off transistor M4 may be connected in common the first signal line CTL1. Gate electrodes of the third transistor T3, the fourth transistor T4, the first off transistor M1, and the second off transistor M2 may be connected in common to the second signal line CTL2.

In such an embodiment, the signal distribution circuit 240 and the scan-off circuit 260 are provided in the display area DA, such that a dead space or an undesired bezel space in a non-display area of the display panel 100A may be reduced and minimized.

Figure 8:
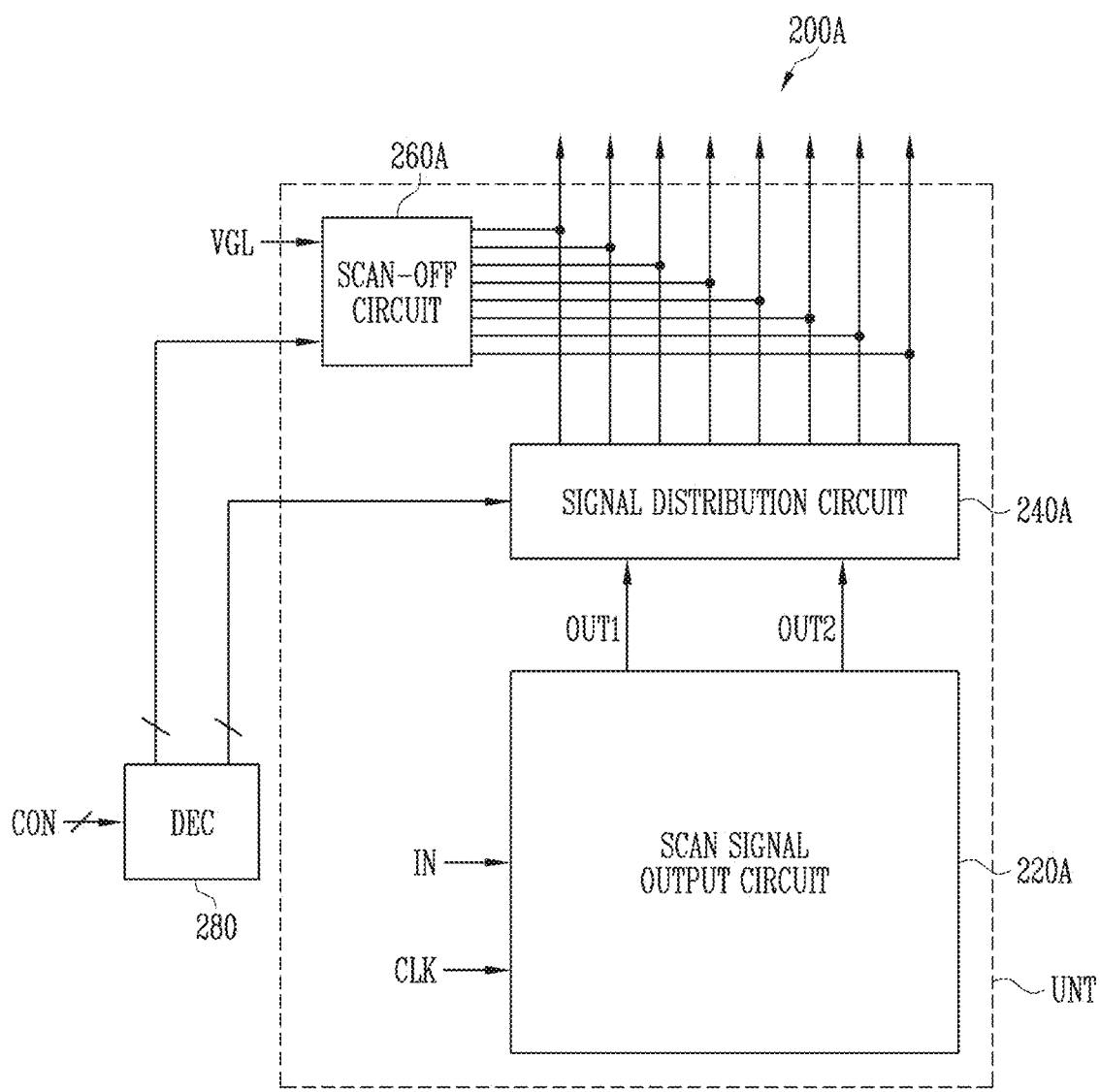
FIG. 8 is a block diagram illustrating an embodiment of the scan driver included in the display device of FIG. 1.

FIG. 8 is a block diagram illustrating an embodiment of the scan driver included in the display device of FIG. 1.

In FIG. 8, the same reference numerals are assigned to the same or similar components described with reference to FIG. 5, and any repetitive detailed descriptions thereof will be omitted. Also, a scan driver 200A of FIG. 8 may have a configuration substantially identical or similar to that of the scan driver 200 of FIG. 5, except that 1:4 demultiplexing is performed on output signals.

Referring to FIGS. 1, 3, and 8, the scan driver 200A may include a scan signal output circuit 220A, a signal distribution circuit 240A, and a scan-off circuit 260A. The scan driver 200A may further include a decoder (DEC in FIG. 8) 280.

In an embodiment, the scan signal output circuit 220A and the decoder 280 may be included in a scan driver chip SIC, and the signal distribution circuit 240A and the scan-off circuit 260A may be included (integrated) in a display panel 100. In FIG. 8, a basic unit UNT of 1:4 demultiplexing driving for outputting eight scan signals using first and second output signals OUT1 and OUT2 is illustrated. Hereinafter, the basic unit UNT is described as outputting first to eighth scan signals that are supplied to the first to eighth scan lines.

The scan signal output circuit 220A may shift the input signal IN based on a clock signal CLK, and may alternately output eight output signals as a first output signal OUT1 or a second output signal OUT2. In an embodiment, for example, the first output signal OUT1 may include first, third, fifth, and seventh scan signals, and the second output signal OUT2 may include second, fourth, sixth, and eighth scan signals.

The signal distribution circuit 240A may output one of the first, third, fifth, and seventh scan signals as the first output signal OUT1 and output one of the second, fourth, sixth, and eighth scan signals as the second output signal OUT2 in response to first to fourth distribution control signals.

The scan-off circuit 260A may provide a low voltage VGL corresponding to a gate-off level to at least one of the first to eighth scan lines in response to first to fourth scan-off control signals.

The decoder 280 may generate the first to fourth distribution control signals and the first to fourth scan-off control signals in response to control signals CON provided from an external device, such as a timing controller 400. In an embodiment, for example, the decoder 280 may generate eight different signals using the three control signals CON. The eight signals may be the first to fourth distribution control signals and the first to fourth scan-off control signals, respectively.

Accordingly, the number of panel pads P_PD and output lines, through which the output signals OUT1 and OUT2 are supplied from the scan driver chip SIC to the display panel 100, may be further reduced.

Figure 9:
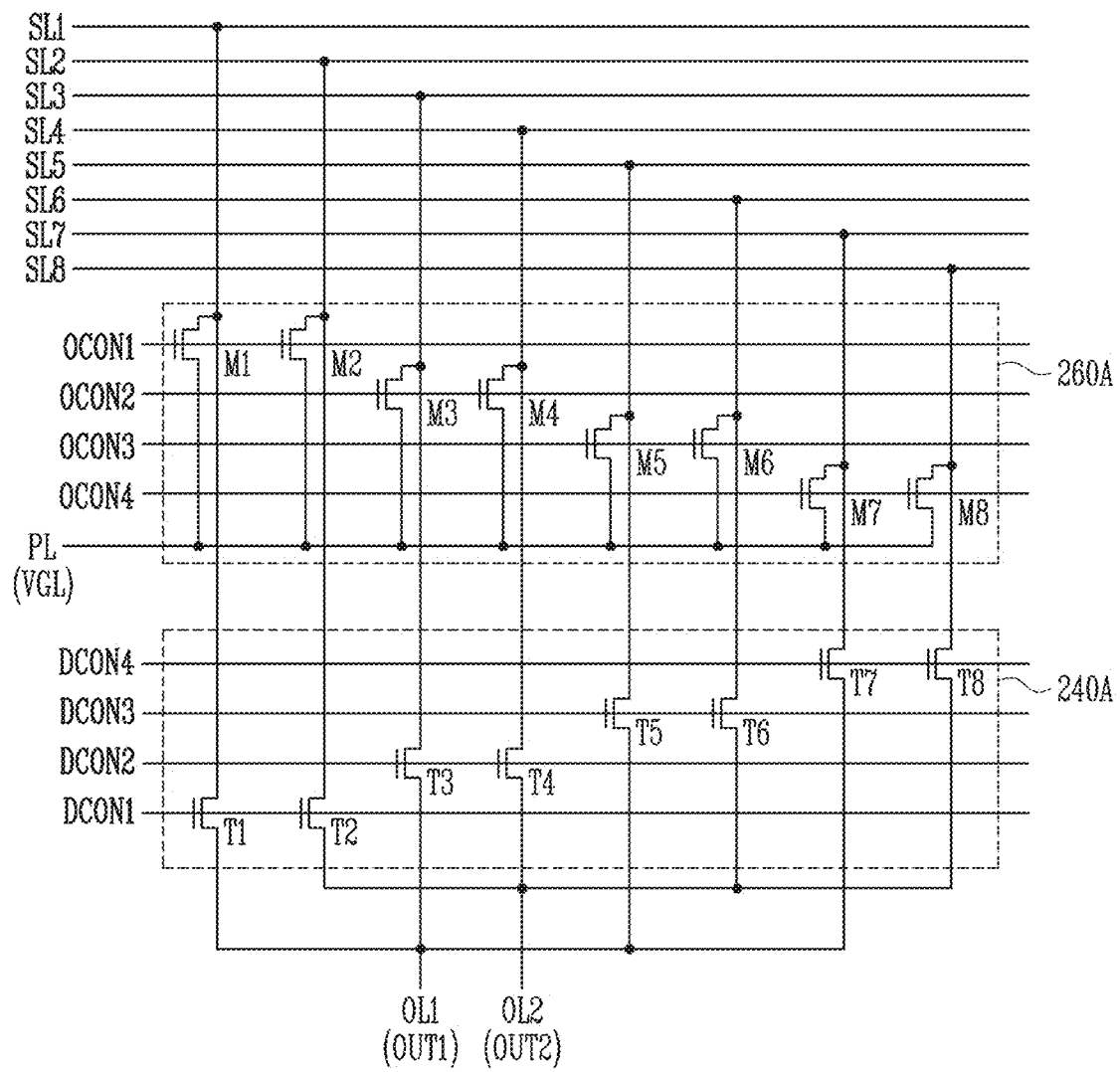
FIG. 9 is a circuit diagram illustrating an embodiment of a signal distribution circuit and a scan-off circuit included in the scan driver of FIG. 8.
Figure 10:
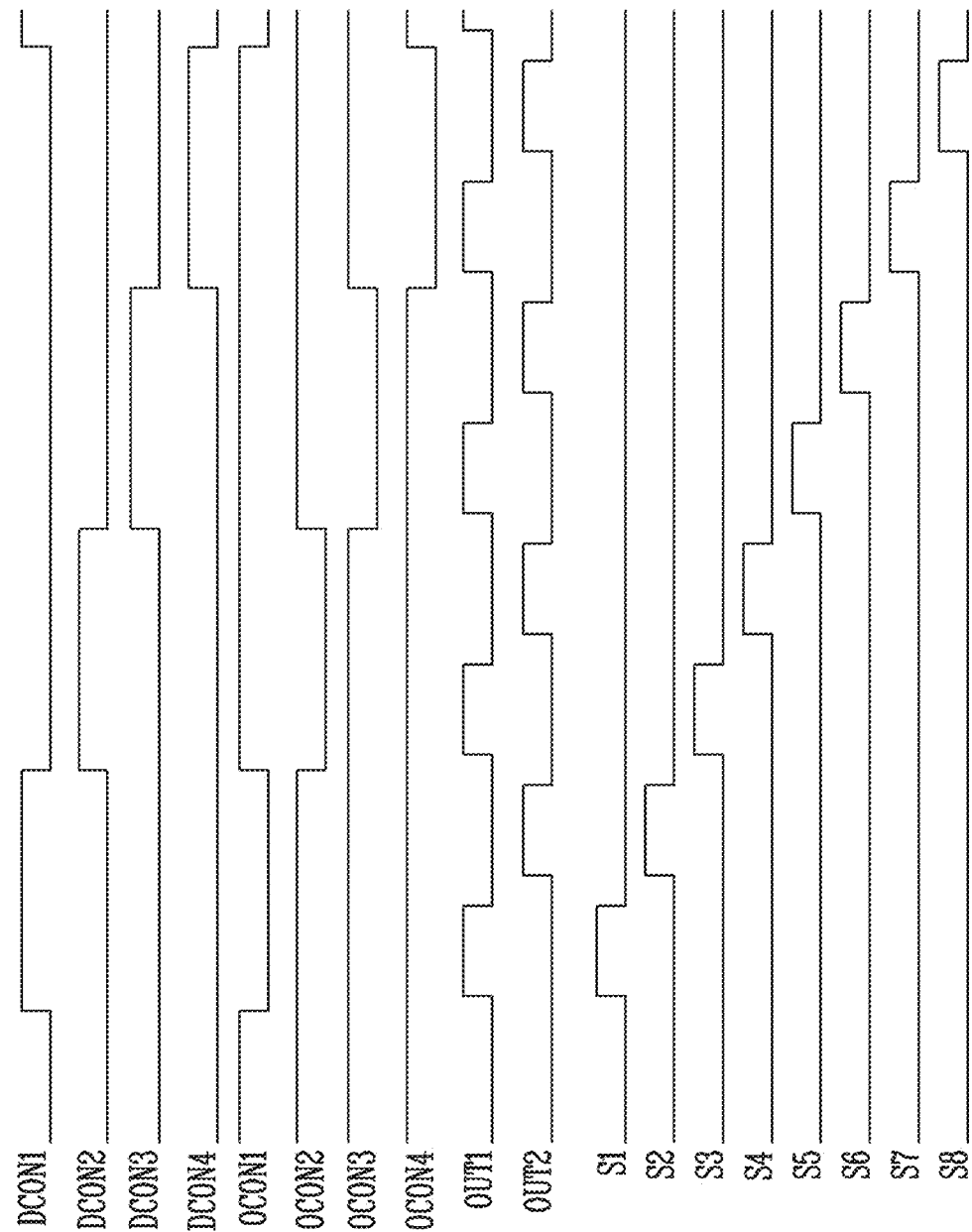
FIG. 10 is a signal timing diagram illustrating an embodiment of the operation of the signal distribution circuit and the scan-off circuit of FIG. 9.

FIG. 9 is a circuit diagram illustrating an embodiment of the signal distribution circuit and the scan-off circuit included in the scan driver of FIG. 8, and FIG. 10 is a signal timing diagram illustrating an embodiment of the operation of the signal distribution circuit and the scan-off circuit of FIG. 9.

In FIGS. 9 and 10, the same reference numerals are assigned to the same or similar components described with reference to FIGS. 5 and 6, and any repetitive detailed descriptions thereof will be omitted. Further, the circuit of FIG. 9 may have a configuration substantially identical or similar to that of the signal distribution circuit 240 and the scan-off circuit 260 of FIG. 5, except that fifth to eighth transistors T5 to T8 and fifth to eighth off transistors M5 to M8 are added (i.e., except that 1:4 demultiplexing is performed).

Referring to FIGS. 3, 8, 9, and 10, in an embodiment, the signal distribution circuit 240A may include first to eighth transistors T1 to T8, and the scan-off circuit 260A may include first to eighth off transistors M1 to M8.

The first, third, fifth, and seventh transistors T1, T3, T5, and T7 may be electrically connected to a first output line OL1 and first, third, fifth, and seventh scan lines SL1, SL3, SL5, and SL7, respectively. The second, fourth, sixth, and eighth transistors T2, T4, T6, and T8 may be electrically connected to a second output line OL2 and second, fourth, sixth, and eighth scan lines SL2, SL4, SL6, and SL8, respectively.

The first and second transistors T1 and T2 may be turned on in response to a first distribution control signal DCON1, the third and fourth transistors T3 and T4 may be turned on in response to a second distribution control signal DCON2, the fifth and sixth transistors T5 and T6 may be turned on in response to a third distribution control signal DCON3, and the seventh and eighth transistors T7 and T8 may be turned on in response to a fourth distribution control signal DCON4.

In an embodiment, as illustrated in FIG. 10, the first output signal OUT1 may be provided to one of the first, third, fifth, and seventh scan lines SL1, SL3, SL5, and SL7 in response to the first to fourth distribution control signals DCON1 to DCON4, and one of the first, third, fifth, and seventh scan signals S1, S3, S5, and S7 may be output. In such an embodiment, the second output signal OUT2 may be provided to one of the second, fourth, sixth, and eighth scan lines SL2, SL4, SL6, and SL8 in response to the first to fourth distribution control signals DCON1 to DCON4, and one of the second, fourth, sixth, and eighth scan signals S2, S4, S6, and S8 may be output. In an embodiment, for example, the first to fourth distribution control signals DCON1 to DCON4 may sequentially have a gate-on level.

The first to eighth off transistors M1 to M8 may be electrically connected between the power line PL and the first to eighth scan lines SL1 to SL8, respectively.

The first and second off transistors M1 and M2 may be turned on in response to a first scan-off control signal OCON1, the third and fourth off transistors M3 and M4 may be turned on in response to a second scan-off control signal OCON2, the fifth and sixth off transistors M5 and M6 may be turned on in response to a third scan-off control signal OCON3, and the seventh and eighth off transistors M7 and M8 may be turned on in response to a fourth scan-off control signal OCON4.

In an embodiment, as illustrated in FIG. 10, during a period in which the first scan-off control signal OCON1 has a gate-on level (i.e., a high level), the first and second scan signals S1 and S2 may have a low voltage VGL. Similarly, during a period in which the second scan-off control signal OCON2 has a gate-on level, the third and fourth scan signals S3 and S4 may have a low voltage VGL, during a period in which the third scan-off control signal OCON3 has a gate-on level, the fifth and sixth scan signals S5 and S6 may have a low voltage VGL, and during a period in which the fourth scan-off control signal OCON4 has a gate-on level, the seventh and eighth scan signals S7 and S8 may have a low voltage VGL.

In an embodiment, the first to fourth scan-off control signals OCON1 to OCON4 may be inverted signals of the first to fourth distribution control signals DCON1 to DCON4, respectively. In an embodiment, for example, switching of the first and second transistors T1 and T2 may be performed in reverse to switching of the first and second off transistors M1 and M2.

In an embodiment, since driving in which the scan signals S1 to S8 illustrated in FIG. 10 are sequentially output is substantially the same as that described above with reference to FIG. 6, any repetitive detailed descriptions thereof will be omitted.

In embodiments of the invention, as described above, a display device may include a signal distribution circuit and a scan-off circuit of a scan driver integrated into a display panel. In such embodiments, demultiplexing of scan signal output may be performed using the signal distribution circuit and the scan-off circuit, and thus a dead space and a bezel in a display panel may be reduced. In such embodiments, the signal distribution circuit is integrated into a display panel, such that the number of panel pads and chip pads and the size of a scan driver chip may be reduced, and the scan driver chip and a data driver chip may be mounted together in a single flexible film. Thus, manufacturing costs may be reduced.

In such embodiments, the scan-off circuit may stably maintain signals supplied to inactive scan lines at a low voltage, thus preventing malfunction of pixels.

In such embodiments, since scan lines that are not adjacent to each other share output lines with each other, a scan signal may fall (or sink) due to an output signal having a gate-off level, which is output from a scan signal output circuit, rather than a low voltage supplied from a power line. Therefore, compared to a scheme for pulling down a scan signal using the low voltage, the effect of preventing a kickback failure from occurring when a transistor (switching transistor) of a pixel is turned off due to the interruption of supply of a scan signal may be further improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device, comprising:
a display panel including pixels connected to scan lines and data lines, and connection lines, each connected to a corresponding scan line of the scan lines; and
a scan driver which drives the scan lines,
wherein the scan driver comprises:
a scan signal output circuit which outputs a first output signal as a scan signal to a first output line and outputs a second output signal as the scan signal to a second output line;
a signal distribution circuit which outputs the first output signal to a first connection line of the connection lines or a third connection line of the connection lines and output the second output signal to a second connection line of the connection lines or a fourth connection line of the connection lines, in response to a first distribution control signal and a second distribution control signal; and
a scan-off circuit which outputs a gate-off level to at least one of the scan lines in response to a first scan-off control signal and a second scan-off control signal,
wherein the first to fourth connection lines are respectively connected to first to fourth scan lines of the scan lines extending in a first direction,
wherein the first to fourth scan lines are sequentially arranged in a second direction intersecting the first direction,
wherein each of the signal distribution circuit and the scan-off circuit comprises a plurality of transistors, and
wherein the transistors of each of the signal distribution circuit and the scan-off circuit are arranged between the pixels in a display area of the display panel.

2. The display device according to claim 1, wherein the first to fourth connection lines are sequentially arranged in the first direction.

3. The display device according to claim 1, wherein the transistors of the signal distribution circuit comprise:
a first transistor connected between the first output line and the first connection line, wherein the first transistor is turned on in response to the first distribution control signal;
a second transistor connected between the second output line and the second connection line, wherein the second transistor is turned on in response to the first distribution control signal;
a third transistor connected between the first output line and the third connection line, wherein the third transistor is turned on in response to the second distribution control signal; and
a fourth transistor connected between the second output line and the fourth connection line, wherein the fourth transistor is turned on in response to the second distribution control signal.

4. The display device according to claim 3, wherein the transistors of the scan-off circuit comprise:
a first off transistor connected between a power line supplying a voltage having a gate-off level and the first scan line, wherein the first off transistor is turned on in response to the first scan-off control signal;
a second off transistor connected between the power line and the second scan line, wherein the second off transistor is turned on in response to the first scan-off control signal;
a third off transistor connected between the power line and the third scan line, wherein the third off transistor is turned on in response to the second scan-off control signal; and
a fourth off transistor connected between the power line and the fourth scan line, wherein the fourth off transistor is turned on in response to the second scan-off control signal.

5. The display device according to claim 4, wherein the second distribution control signal is an inverted signal of the first distribution control signal.

6. The display device according to claim 4, wherein the first distribution control signal and the second scan-off control signal are same signals as each other which are provided from a same signal line.

7. The display device according to claim 6, wherein the second distribution control signal and the first scan-off control signal are same signals as each other which are provided from a same signal line.

8. The display device according to claim 7, wherein, during a gate-on period of the first distribution control signal, the first and second output signals having a gate-on level are sequentially provided to the first scan line and the second scan line, respectively.

9. The display device according to claim 7, wherein, during a gate-on period of the second distribution control signal, the first and second output signals having a gate-on level are sequentially provided to the third scan line and the fourth scan line, respectively.

10. The display device according to claim 4, wherein:
the scan signal output circuit is disposed on a flexible film connected to the display panel,
the signal distribution circuit and the scan-off circuit are integrated into the display panel, and
the signal distribution circuit is connected to the scan signal output circuit through the first output line and the second output line.

11. The display device according to claim 10, wherein at least a portion of the first to fourth transistors and the first to fourth off transistors are disposed in a display area of the display panel in which the pixels are arranged.

12. The display device according to claim 10, further comprising:
a data driver disposed on one side of the display panel, together with the scan signal output circuit, wherein the data driver drives the data lines.

13. The display device according to claim 12, wherein the data driver is disposed, together with the scan signal output circuit, on the flexible film.

14. The display device according to claim 4, wherein the transistors of the signal distribution circuit further comprise:
a fifth transistor connected between the first output line and a fifth connection line, wherein the fifth transistor is turned on in response to a third distribution control signal;
a sixth transistor connected between the second output line and a sixth connection line, wherein the sixth transistor is turned on in response to the third distribution control signal;

a seventh transistor connected between the first output line and a seventh connection line, wherein the seventh transistor is turned on in response to a fourth distribution control signal; and an eighth transistor connected between the second output line and an eighth connection line, wherein the eighth transistor is turned on in response to the fourth distribution control signal.

15. The display device according to claim 14, wherein the transistors of the scan-off circuit further comprise:

a fifth off transistor connected between the power line and a fifth scan line, wherein the fifth off transistor is turned on in response to a third scan-off control signal;

a sixth off transistor connected between the power line and a sixth scan line, wherein the sixth off transistor is turned on in response to the third scan-off control signal;

a seventh off transistor connected between the power line and a seventh scan line, wherein the seventh off transistor is turned on in response to a fourth scan-off control signal; and an eighth off transistor connected between the power line and an eighth scan line, wherein the eighth off transistor is turned on in response to the fourth scan-off control signal.

16. The display device according to claim 15, wherein:
the scan driver further comprises:
a decoder which generates the first to fourth distribution control signals and the first to fourth scan-off control signals in response to a control signal provided from an external device, and the first to fourth scan-off control signals are inverted signals of the first to fourth distribution control signals, respectively.

17. The display device according to claim 1, wherein the scan signal output circuit comprises:

shift registers which sequentially outputs modified signals of an input signal based on a clock signal and dependently connected to each other;

logic OR circuits which generates first intermediate signals using outputs of two non-adjacent shift registers, among the shift registers;

logic AND circuits which generates second intermediate signals using respective outputs of the logic OR circuits and an output enable signal;

level shifters which adjusts voltage levels of the second intermediate signals to correspond to a high level or a low level of the scan signal; and buffers which provides outputs of the level shifters to the first output line and the second output line, respectively.

18. A display device, comprising:
a display panel including pixels connected to scan lines and data lines, and connection lines, each connected to a corresponding scan line of the scan lines; and a scan driver which drives the scan lines, wherein the scan driver comprises:

a scan signal output circuit which outputs a first output signal as a scan signal to a first output line and outputs a second output signal as the scan signal to a second output line;

a signal distribution circuit which outputs the first output signal to a first connection line of the connection lines or a third connection line of the connection lines and outputs the second output signal to a second connection line of the connection lines or a fourth connection line of the connection lines in response to a first distribution control signal and a second distribution control signal; and a scan-off circuit which output a gate-off level to at least one of the scan lines in response to a first scan-off control signal and a second scan-off control signal, wherein the first to fourth connection lines are respectively connected to first to fourth scan lines of the scan lines extending in a first direction, wherein each of the signal distribution circuit and the scan-off circuit comprises a plurality of transistors, wherein the transistors of each of the signal distribution circuit and the scan-off circuit are arranged between the pixels in a display area of the display panel, wherein, during a gate-on period of the first distribution control signal, the first and second output signals having a gate-on level are sequentially provided to the first scan line and the second scan line, respectively, and wherein, during a gate-on period of the second distribution control signal, the first and second output signals having the gate-on level are sequentially provided to the third scan line and the fourth scan line, respectively.

19. The display device according to claim 18, wherein:
the first scan-off control signal is an inverted signal of the first distribution control signal, and the second scan-off control signal is an inverted signal of the second distribution control signal.

\* \* \* \* \*